(12) United States Patent
Liberg et al.

(10) Patent No.: US 10,299,263 B2
(45) Date of Patent: *May 21, 2019

(54) METHODS, A WIRELESS DEVICE, A RADIO NETWORK NODE FOR MANAGING A CONTROL BLOCK

(71) Applicant: TELEFONAKTIEBOLAGET LM ERICSSON (PUBL), Stockholm (SE)

(72) Inventors: Olof Liberg, Stockholm (SE); Mårten Sundberg, Årsta (SE); John Walter Diachina, Garner, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/719,437

(22) Filed: Sep. 28, 2017

(65) Prior Publication Data

US 2018/0020436 A1  Jan. 18, 2018

Related U.S. Application Data

(60) Continuation of application No. 15/232,552, filed on Aug. 9, 2016, now Pat. No. 9,794,927, which is a
(Continued)

(51) Int. Cl.
*H04W 72/04* (2009.01)
*H03M 13/17* (2006.01)
(Continued)

(52) U.S. Cl.
CPC ....... *H04W 72/042* (2013.01); *H03M 13/175* (2013.01); *H03M 13/618* (2013.01);
(Continued)

(58) Field of Classification Search
CPC ............ H04W 72/042; H04W 72/0406; H04L 1/0082; H04L 1/0058; H04L 1/0057; H04L 1/0041; H03M 13/618; H03M 13/175
(Continued)

(56) References Cited

U.S. PATENT DOCUMENTS

2005/0028066 A1   2/2005  Raahemi
2007/0217388 A1   9/2007  Shiizaki et al.
(Continued)

FOREIGN PATENT DOCUMENTS

CN     102754513 A    10/2012
WO   2011099922 A1     8/2011
(Continued)

OTHER PUBLICATIONS

3GPP TS 45.003 V11.1.0 (Nov. 2012), 3rd Generation Partnership Project; Technical Specification Group GSM/EDGE Radio Access Network; Channel coding (Release 11), GP-56, the whole document.
(Continued)

*Primary Examiner* — Faisal Choudhury (57) ABSTRACT

Methods, a wireless device (110) and a radio network node (120) for managing a control block are disclosed. An extended Temporary Flow Identifier, eTFI, is assigned to the wireless device (110) by the radio network node (120). The radio network node (120) constructs the control information. The radio network node (120) performs a bit-wise modulo two addition with a control block and a combination of the eTFI and a pre-determined bit pattern to obtain a modified control block. The radio network node (120) adds channel coding redundancy. The radio network node (120) maps the modified control block onto physical resources. The radio network node (120) sends the modified control block to the
(Continued)

wireless device (110). The wireless device (110) decodes the received modified control block removing the channel coding redundancy, performs a bit-wise modulo two addition between the modified control block and a combination of the eTFI and a pre-determined bit pattern to obtain a control block. The wireless device (110) decodes the control block using FIRE-decoding to obtain the control information. The wireless device (110) determines it is the intended recipient of the control information if the TFI information therein matches its assigned TFI. Corresponding computer programs and carriers therefor are also disclosed.

22 Claims, 4 Drawing Sheets

Related U.S. Application Data division of application No. 14/247,897, filed on Apr. 8, 2014, now Pat. No. 9,544,888.

(60) Provisional application No. 61/900,067, filed on Nov. 5, 2013.

(51) Int. Cl.
  *H03M 13/00* (2006.01)
  *H04L 1/00* (2006.01)

(52) U.S. Cl.
  CPC .......... *H04L 1/0041* (2013.01); *H04L 1/0057* (2013.01); *H04L 1/0058* (2013.01); *H04L 1/0082* (2013.01); *H04W 72/0406* (2013.01)

(58) Field of Classification Search
  USPC ........................................................ 370/329
  See application file for complete search history.

(56) References Cited

U.S. PATENT DOCUMENTS

| | | | |
|---|---|---|---|
| 2007/0268834 A1 | 11/2007 | Buckley et al. | |
| 2008/0285506 A1 | 11/2008 | Rudolf et al. | |
| 2011/0013717 A1* | 1/2011 | Josiam ............... | H04W 72/0413 375/295 |
| 2011/0170459 A1 | 7/2011 | Anderson | |
| 2011/0194410 A1* | 8/2011 | Bergstrom ............ | H04W 76/11 370/235 |
| 2012/0269145 A1* | 10/2012 | Widell .................. | H04L 1/0025 370/329 |
| 2014/0064161 A1 | 3/2014 | Sikri et al. | |
| 2014/0064194 A1 | 3/2014 | Schliwa-Bertling et al. | |

FOREIGN PATENT DOCUMENTS

| | | | |
|---|---|---|---|
| WO | 2013038391 | A1 | 3/2013 |
| WO | WO-2013/070163 | A1 | 5/2013 |

OTHER PUBLICATIONS

Proakis, J. G. And Salehi, M., Digital Communications (5$^{th}$ edition), McGraw-Hill International edition, Nov. 6, 2007, pp. 475-477.

3GPP TS 45.005 V11.3.0 (Mar. 2013), 3rd Generation Partnership Project; Technical Specification Group GSM/EDGE Radio Access Network; Radio transmission and reception (Release 11), GP-57, the whole document.

Eva-Karin Andersson; Användning av Fire-kod för felrättning och felupptäckt i GSM; Department of Information Theory, Lunds Univeristy; 1995; 64 pages.

3GPP TS 44.060 V11.6.0 (Sep. 2013), 3rd Generation Partnership Project; Technical Specification Group GSM/EDGE Radio Access Network; General Packet Radio Service (GPRS); Mobile Station (MS)—Base Station System (BSS) interface; Radio Link Control / Medium Access Control (RLC/MAC) protocol (Release 11), GP-59, the whole document.

Telefon AB LM Ericsson, ST-Ericsson SA, "DLMC—Extended TFI Addressing space", 3GPP TSG GERAN#59, Tdoc GP-130662, Agenda item 7.1.5.2.2, 7.2.5.3.1, Sofia, Bulgaria, Aug. 26-30, 2013, the whole document.

Telefon AB LM Ericsson et al., "Downlink Multi Carrier GERAN", 3GPP TSG GERAN Meeting #55, GP-121158, Agenda item 6.1, 7.1.5.4, 7.2.5.3.10, 3GPP™ Work Item Description, Vienna, Austria, Aug. 27-31, 2012, the whole document.

Telefon AB LM Ericsson et al, "Downlink Multi Carrier GERAN", 3GPP TSG GERAN Meeting #55, GP-121118, Agenda item 6.1, 7.1.5.4, 7.2.5.3.10, 3GPP™ Work Item Description, Vienna, Austria, Aug. 27-31, 2012, the whole document.

Ericsson, "DLMC—Correction of ETFI Usage in PACCH", 3GPP TSG GERAN#62, Tdoc GP-140343, Agenda Item 7.1.5.2.2m Valencia, Spain, May, 26-30, 2014, the whole document.

\* cited by examiner

METHODS, A WIRELESS DEVICE, A RADIO NETWORK NODE FOR MANAGING A CONTROL BLOCK

CROSS-REFERENCE TO RELATED APPLICATIONS

This application is a continuation of U.S. patent application Ser. No. 15/232,552, filed on 9 Aug. 2016, issued as U.S. Pat. No. 9,794,927 on 17 Oct. 2017, which is a divisional of U.S. patent application Ser. No. 14/247,897, filed on 8 Apr. 2014, issued as U.S. Pat. No. 9,544,888 on 10 Jan. 2017, which claimed the benefit of U.S. Provisional Application Ser. No. 61/900,067, filed on 5 Nov. 2013. The entire contents of each of these applications are hereby incorporated by reference for all purposes.

TECHNICAL FIELD

Embodiments herein relate to wireless communication systems, such as telecommunication systems. In particular, a method and a wireless device as well as a method and a radio network node for managing a control block are disclosed. Corresponding computer programs and carriers therefor are also disclosed.

BACKGROUND

Within telecommunication systems, such as within a Global System for mobile communications (GSM) Enhanced Data Rates for GSM Evolution (EDGE) Radio Access Network (GERAN) network, so called Packet Switched (PS) Temporary Block Flow (TBF) are used to enable transfer of user data between e.g. a Radio Base Station (RBS) and a Mobile Station (MS), such as a wireless device. The PS TBF is assigned a Temporary Flow Identity (TFI) value. The TFI value is uniquely identifying a TBF among concurrent TBFs in the same direction, i.e. uplink for transfer of data from the mobile station to the radio base station or downlink for transfer of data from the radio base station to the mobile station, assigned the same Packet Data Channel (PDCH) resources on the same carrier. The same TFI value may be used concurrently for other TBFs on other PDCH resources in the same direction and for TBFs in the opposite direction. Hence, a TFI is a unique identifier on a given PDCH resource. This need for TFI uniqueness within the context of any given set of PDCH resources, on a given carrier limits the number of devices that may share the same radio resources. In case of devices supporting Downlink Multi-carrier (DLMC) mode of operation, the limitation will be even more severe as each downlink TBF supported using DLMC will be assigned the use of PDCH resources on multiple downlink carriers thereby substantially increasing the number of devices being assigned the same PDCH resources for any given carrier. The DLMC mode of operation is specified in Third Generation Partnership Project (3GPP) Technical Specification (TS) 44.060, GERAN, Mobile Station (MS)—Base Station System (BSS) interface—Radio Link Control/Medium Access Control (RLC/MAC) protocol.

The TFI itself is a 5-bit field encoded as binary number in the range 0 to 31, which is typically provided to the MS by the GERAN network upon TBF assignment.

A Radio Link Control (RLC)/Medium Access Control (MAC) block sent on a given uplink/downlink carrier is associated with a certain TBF. There are two types of RLC/MAC blocks; RLC/MAC data blocks and RLC/MAC control blocks for user data and control information, respectively. A RLC data block is uniquely identified by the TFI together with the direction in which the RLC data block is sent, and a RLC/MAC control block is uniquely identified by the TFI together with the direction in which the RLC/MAC control block is sent. In case Starting Sequence Number (SSN)-based Fast Ack/Nack Reporting (FANR) is used, the TFI identifying the TBF being acknowledged is included in the Piggy-backed Ack/Nack (PAN) field. Ack/Nack stands for Acknowledge/Non-acknowledge.

This means that e.g. every time an MS receives a downlink data block or control block on one of its assigned PDCHs of a given carrier, it will use the included TFI field to determine if the block belongs to any—there can be more than one—of the TBFs associated with that specific MS. If so, the block is obviously intended for the specific MS whereupon the corresponding payload is decoded and delivered to higher layers, but otherwise discarded. In the uplink direction, the behavior is the same, i.e. network uses the TFI value to identify blocks that belong to the same TBF. This is an existing mechanism used in GERAN networks for facilitating the multiplexing of multiple users on the same PDCH resources on a given carrier.

The existing TFI addressing space is considered to be insufficient assuming the current increase of PS traffic observed in GERAN networks over the world. Furthermore, the introduction of DLMC in 3GPP Release 12 makes the need to extend the TFI space acute, GP-130662 DLMC—Extended TFI Addressing Space, 3GPP GERAN#59, Ericsson & ST-Ericsson hereby incorporated by reference.

In the context of DLMC, GERAN Plenary (GP)-121158 Work Item Description (WID): Downlink Multi Carrier GERAN, 3GPP GERAN#55, Ericsson & ST-Ericsson hereby incorporated by reference, a TFI expansion is needed to increase the TFI addressing space of devices multiplexed on the same radio resources of a given downlink carrier. Solutions for TFI expansion exist for radio blocks carrying user plane payload, wherein a Cyclic Redundancy Check (CRC) code is used solely for error detection, see for example, WO2013/070163, which hereby is incorporated by reference.

3GPP TS 45.003, version 11.1.0, section 6.2.1; GERAN; Channel Coding describes a bit-wise modulo two (2) addition (XOR) between a TFI and PAN CRC field. According to aforementioned WO2013/070163, this concept is extended to also apply to an extended TFI (eTFI) field and a subset of the CRC bits of a RLC/MAC data block header or a subset of the CRC bits of a PAN field. A solution in aforementioned WO2013/070163 is based on the observation that a PAN field CRC or RLC/MAC header CRC XOR'ed with an eTFI will only be decodable by a MS assigned the very same eTFI. As this prevents legacy mobiles, e.g. multiplexed on the same PDCH as a mobile having an assigned eTFI, from successfully performing a CRC check when receiving a PAN field CRC or a RLC/MAC header CRC that has been XOR'ed with an eTFI, it provides a backwards compatible extension of the TFI identifier space. This is because the impact of the eTFI XOR-ing in this case is effectively seen as an error pattern by the legacy MS, and since the CRC code cannot correct errors but only detect them, the resulting CRC check will be erroneous and the legacy MS will discard the radio block.

The solution in aforementioned WO2013/070163 is however not capable of providing the desired extension of the TFI space when addressing a FIRE-coded control block or RLC/MAC data block. Remark: "FIRE", or "Fire", is the name of a person contributing to the development of FIRE-codes and FIRE-coding techniques. The desired extension cannot be provided because the FIRE-code is a class of cyclic block codes used both for burst error correction and error detection. The burst error correction capability of the FIRE-code is defined by a length "b" of the shortest uncorrectable burst error, Digital Communications (5th edition), Proakis & Salehi, McGraw-Hill International, ISBN-13: 978-0072957167.

As is known in the art, a FIRE-code is a cyclic burst error correcting code over GF(q) with the generator polynomial $g(x)=(I^{2t-1}-1)p(x)$ where p(x) is a prime polynomial with degree in not smaller than t and p(x) does not divide $I^{2t-1}1$. Block length of the fire code is the smallest integer nsuch that g(I) divides $I^n-1$. Here the FIRE code is defined over a finite field GF(q) of block length n. See also http://en.wikipedia.org/wiki/Cyclic_code and more detailed in "Code Design for Dependable Systems: Theory and Practical Applications", July 2006, by Eiji Fujiwara, printed by Wiley, ISBN: 978-0-471-75618-7.

This implies that if the solutions proposed in aforementioned WO2013/070163 would be applied on a FIRE-coded radio block, a legacy MS would treat the XOR'ed eTFI bits as an error sequence, correct them and then consider the radio block as valid at which point it could erroneously act on it, e.g. if the legacy TFI provided in the radio block header of a FIRE-coded control block addressed to a MS operating in DLMC mode happens to match the TFI assigned to a legacy MS. Hence, a problem may be that the intended segregation between legacy and new eTFI aware MSs is broken and an extension of the TFI field is no longer feasible.

SUMMARY

In view of the above, it has been realized that a solution is missing for the case of radio blocks carrying control plane payload which are currently encoded using a FIRE-code instead of a CRC code. The FIRE-code can be used for both error detection and error correction.

An object may be to alleviate or at least reduce the above mentioned problem.

According to a first aspect, the object is achieved by a method, performed by a wireless device, for managing a modified control block. The modified control block carries control information for the wireless device. The wireless device is served by a radio network node. A TFI and an eTFI are assigned to the wireless device by the radio network node. The wireless device receives the modified control block from the radio network node. The wireless device performs a bit-wise modulo two addition between the modified control block and a combination of its assigned eTFI and a pre-determined bit pattern to obtain a control block. The wireless device decodes the control block using FIRE-decoding to obtain the control information. Furthermore, the wireless device is an intended recipient of the control information when a TFI field of the control information matches the TFI assigned to the wireless device.

According to a second aspect, the object is achieved by a method, performed by a radio network node, for managing a control block for a wireless device. The control block carries control information addressed to the wireless device. The wireless device is served by the radio network node. A TFI and an eTFI are assigned to the wireless device by the radio network node. The radio network node constructs the control information, wherein a header portion of the control information comprises the TFI assigned to the wireless device. The radio network node encodes control information, using FIRE-encoding, to obtain a FIRE-encoded control block. The radio network node performs a bit-wise modulo two addition with the FIRE-encoded control block and a combination of the eTFI assigned to the wireless device and a pre-determined bit pattern to obtain a modified control block. The radio network node adds channel coding redundancy to the modified control block. The radio network node maps the modified control block onto physical resources. The radio network node sends the modified control block to the wireless device.

According to a third aspect, the object is achieved by a wireless device configured to manage a modified control block for carrying control information for the wireless device. The wireless device is servable by a radio network node. A TFI and an eTFI are assignable to the wireless device by the radio network node. The wireless device is configured to receive the modified control block from the radio network node, and to perform a bit-wise modulo two addition between the control block and a combination of its assigned eTFI and a pre-determined bit pattern to obtain a control block. Furthermore, the wireless device is configured to decode the control block using FIRE-decoding to obtain the control information. Furthermore, the wireless device is an intended recipient of the control information when a TFI field of the control information matches the TFI assigned to the wireless device.

According to a fourth aspect, the object is achieved by a radio network node configured to manage a control block for a wireless device. The control block is capable of carrying control information addressed to the wireless device. The wireless device is servable by the radio network node. A TFI and an eTFI are assignable to the wireless device by the radio network node. The radio network node is configured to construct the control information, wherein a header portion of the control information comprises the TFI assigned to the wireless device. The radio network node is further configured to encode the control information, using FIRE-encoding, to obtain a FIRE-encoded control block, to perform a bit-wise modulo two addition with the FIRE-encoded control block and a combination of the eTFI assigned to the wireless device and a pre-determined bit pattern to obtain a modified control block. Moreover, the radio network node is configured to add channel coding redundancy to the modified control block, to map the modified control block onto physical resources, and to send the modified control block to the wireless device.

According to further aspects, the object is achieved by computer programs and carriers for computer programs corresponding to the aspects above.

The wireless device performs the bit-wise modulo two addition between the modified control block and the combination of its assigned eTFI and the pre-determined bit pattern to thereby correct the one or more errors deliberately introduced when a modified control block is produced. The one or more errors are deliberately introduced by the radio network node, by means of the bit-wise modulo two addition between the control block and a combination of the eTFI of the target wireless device and the pre-determined bit pattern, in order to prevent legacy MSs from being able to successfully decode the modified control block. The wireless device decodes the control block using FIRE-decoding to obtain the control information. After performing the bit-wise modulo two addition to correct the deliberately introduced errors, the FIRE-decoding is performed and if found to be successful the wireless device considers itself to be the intended recipient of the control information when the TFI field of the control information matches its assigned TFI. This may happen when any transmission related errors, i.e. unintended errors, are correctable by the FIRE-decoding. At any rate, a legacy MS will never be able to correct the deliberately introduced one or more errors and will therefore never erroneously assume the modified control block to be addressed to it, since a legacy MS do not perform any bit-wise modulo two addition with the combination of the eTFI and the pre-determined bit pattern as above. Thus, the above mentioned object is achieved.

An advantage is hence that the eTFI may provide the desired separation between legacy and eTFI aware MSs, e.g. the wireless device according to embodiments herein.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Throughout the following description similar reference numerals have been used to denote similar elements, units, modules, circuits, nodes, parts, items or features, when applicable. In the Figures, features that appear in some embodiments are indicated by dashed lines.

Figure 1:
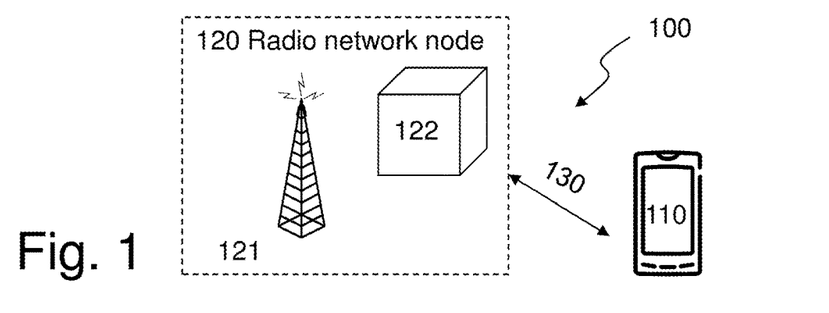
FIG. 1 is a schematic overview of an exemplifying wireless communication system in which embodiments herein may be implemented.

FIG. 1 depicts an exemplifying wireless communication system 100 in which embodiments herein may be implemented. In this example, the wireless communication system 100 is a GERAN network. In other examples, the wireless communication network 100 may be any cellular or wireless communication system, such as a Wideband Code Division Multiple Access (WCDMA) network, Wireless Fidelity (Wi-Fi) or the like.

Furthermore, a wireless device 110 and a radio network node 120 are shown in FIG. 1.

In some examples, the radio network node 120 serves the wireless device 110. The wireless device 110 and the radio network node 120 are capable of communicating 130 with each other.

The radio network node 120 may comprise a Radio Base Station (RBS) 121 and/or a Radio Network Controller (RNC) 122.

Thus, the term "radio network node" may refer to an evolved Node B (eNB), a Radio Network Controller (RNC), a Radio Base Station (RBS), a control node controlling one or more Remote Radio Units (RRUs), an access point or the like.

As used herein, the term "wireless device" may refer to a user equipment, a machine-to-machine (M2M) device, a mobile phone, a cellular phone, a Personal Digital Assistant (PDA) equipped with radio communication capabilities, a smartphone, a laptop or personal computer (PC) equipped with an internal or external mobile broadband modem, a tablet PC with radio communication capabilities, a portable electronic radio communication device, a sensor device equipped with radio communication capabilities or the like. The sensor may be any kind of weather sensor, such as wind, temperature, air pressure, humidity etc. As further examples, the sensor may be a light sensor, an electronic or electric switch, a microphone, a loudspeaker, a camera sensor etc. The term "user" may indirectly refer to the wireless device.

Figure 2:
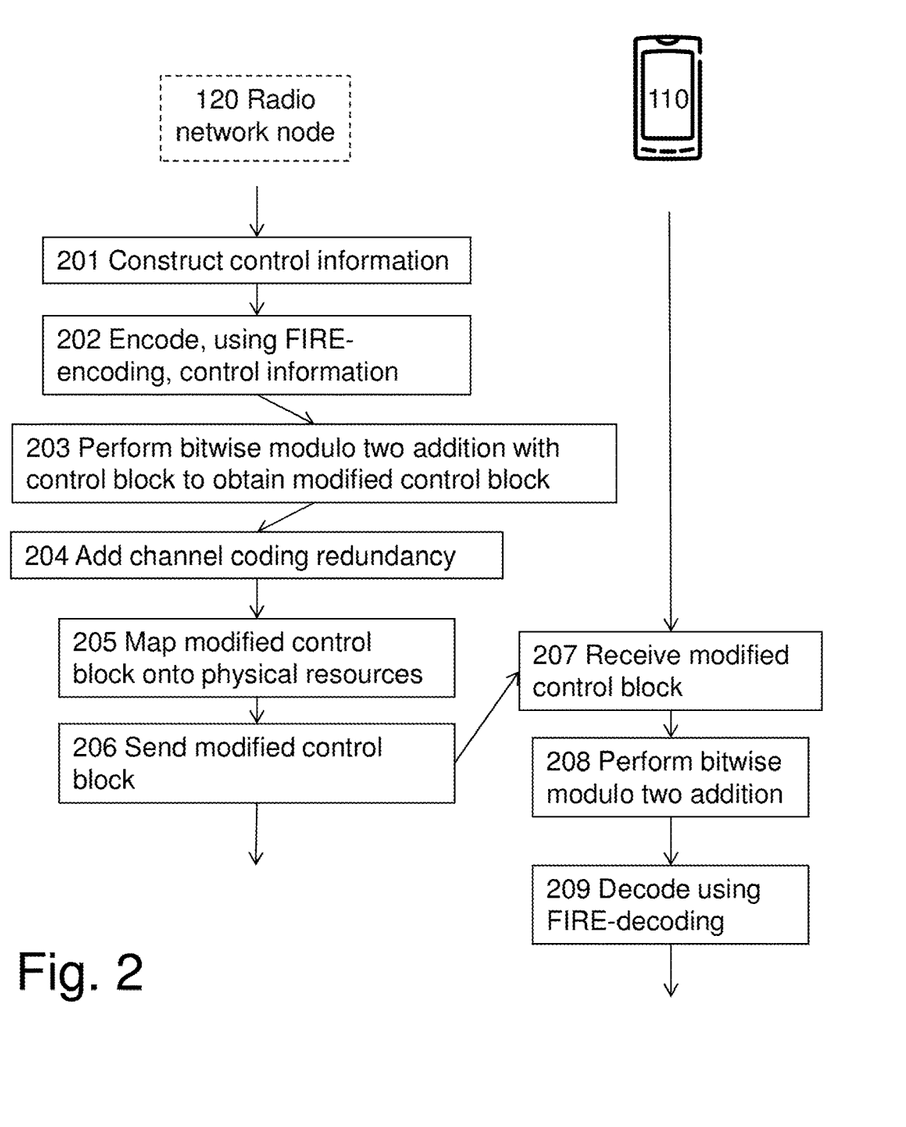
FIG. 2 is a schematic, combined signaling scheme and flowchart illustrating embodiments of the methods when performed in the wireless communication system according to FIG. 1.

FIG. 2 illustrates an exemplifying method according to embodiments herein when performed in connection with the wireless communication system 100 of FIG. 1.

The wireless device 110 performs a method for managing a modified control block and the radio network node 120 performs a method for managing a control block for the wireless device 110. The modified control block carries control information for, e.g. addressed to, the wireless device 110. The wireless device 110 is served by a radio network node 120. A Temporary Flow Identifier, TFI, and an extended Temporary Flow Identifier, eTFI, are assigned to the wireless device 110 by the radio network node 120.

The following actions may be performed in any suitable order.

Action 201

In order for the radio network node 120 to control the wireless device 110, the radio network node 120 constructs the control information. A header portion of the control information comprises a TFI field for carrying the TFI assigned to the wireless device 110. A control message, e.g. a Packet Timeslot Reconfigure message, and its corresponding header may together comprise the control information.

The header portion of the control information may further comprise, for example, a Final Segment (FS) bit used to indicate when a downlink RLC/MAC control block contains the final segment of an RLC/MAC control message and a Relative Reserved Block Period (RRBP) field used to provide the wireless device with information about the specific uplink radio block to use when it sends a response to a polling request.

Action 202

The radio network node 120 encodes control information, using FIRE-encoding, to obtain a FIRE-encoded control block. The radio network node 120 adds error correction capability to the control information by including a FIRE-code in the FIRE-encoded control block. As a result, the FIRE-encoded control block comprises information bits, representing the control information, and parity bits in the form of the FIRE-code. Expressed differently, the FIRE-encoded control block comprises the control information and the FIRE-code.

Action 203

In order to prevent a legacy MS from potentially successfully decoding a FIRE-encoded control block, one or more deliberate errors may be introduced whereby the radio network node 120 performs a bit-wise modulo two addition with the FIRE-encoded control block and a combination of the eTFI assigned to the wireless device 110 and a pre-determined bit pattern. Thus, a modified control block is obtained.

In some examples, the pre-determined bit pattern is applied, e.g. when performing the bit-wise modulo two addition, among the parity bits and bits of the eTFI are also applied among the parity bits. This may mean that the modified control block comprises parity bits. Further, the bit-wise modulo two addition of the combination of the eTFI and the pre-determined bit pattern may be performed using bit positions among the parity bits.

Again, expressed somewhat differently, bits of both the eTFI and the pre-determined bit pattern may be applied, such as positioned, at pre-determined bit positions in the control block. If the wireless device 110 is informed about the deliberate introduction of one or more errors using the pre-determined bit positions, the wireless device 110 may be able to correct these one or more errors.

In order to ensure that the deliberately introduced one or more errors are not corrected by the legacy MS, the pre-determined bit pattern may be distributed over a distance being equal to or exceeding a shortest uncorrectable burst error length. In some examples, the shortest uncorrectable burst error length may be 18 bits.

The pre-determined bit pattern may include three bits, wherein each of the three bits may be set. When a bit is set it means that the bit is assigned a value of one, or logical one/true. In contrast thereto, when a bit is cleared it means that the bit is assigned a value of zero, or logical zero/false. This means that for each bit of the control block that is XORed with the pre-determined bit pattern, that each bit will be flipped, i.e. modified from set to cleared or from cleared to set. Any bits of the pre-determined bit pattern that are cleared will not provide a deliberate error in the control block, since XOR-ing with a zero does not provided any flipping of bits. Hence, it may be ensured that the desired one or more deliberate errors are introduced by XOR-ing using the pre-determined bit pattern, which comprises all 1's.

Action 204

The radio network node 120 adds channel coding redundancy to the modified control block according to manners known in the art. A purpose of the channel coding is to make reception, at the wireless device 110, of the modified control block, transmitted by the radio network node 120 in action 206, more reliable.

Action 205

The radio network node 120 maps the channel coded modified control block onto physical resources according to manners known in the art. This means, for example, that the radio network node 120 determines which physical resources, e.g. time and/or frequency resources which may be continuous or scattered, to use when performing action 206.

Action 206

In order to make the wireless device 110 aware about the control information, the radio network node 120 sends the channel coded modified control block to the wireless device 110.

Action 207

When action 206 has been performed, the wireless device 110 receives the channel coded modified control block from the radio network node 120.

This action may include that the wireless device 110 removes, or channel decodes, the channel coding redundancy added by the radio network node 120 in action 204 thereby producing the modified control block.

Action 208

In order to correct the one or more deliberate errors introduced in action 203, the wireless device 110 performs a bit-wise modulo two addition between the modified control block and the combination of the eTFI and the pre-determined bit pattern to obtain the control block. Expressed differently, the bit-wise modulo two addition may be an XOR-operation. The pre-determined bit pattern may be referred to as a beacon, a beacon bit pattern and the like.

Action 209

The wireless device 110 decodes the control block using FIRE-decoding to obtain the control information. When a successful FIRE-decoding has been performed, the FIRE-code of the control block, obtained in action 208, checks, i.e. the FIRE-code of the control block matches with a calculated FIRE-code. The calculated FIRE-code is calculated based on the control information.

The wireless device 110 is the intended recipient of the control information when the FIRE-decoding is successful and the TFI field of the control information matches the TFI assigned to the wireless device 110.

This means that, in order for the wireless device 110 to know whether the control information is intended for it, the wireless device 110 may check a header portion of the control information to read the TFI of the received control block. If the TFI in the header portion matches the TFI that is assigned to the wireless device 110, then the control information is intended for the wireless device 110.

In order to further elaborate on details and describe alternative or additional embodiments, the following examples are provided. Notably, the pre-determined bit pattern is exemplified by a beacon, beacon bits or beacon bit pattern.

In a particular embodiment in this disclosure, it is proposed to, when addressing a FIRE-encoded radio block, as an exemplifying control block, to a wireless device 110 assigned an eTFI, i.e. a non-legacy MS, XOR the radio block with the eTFI field in combination with a beacon bit pattern distributed over a distance being equal to or exceeding the shortest uncorrectable burst error length b. This approach will secure that a legacy MS, multiplexed on the same PDCH resources as the eTFI capable wireless device 110, cannot successfully FIRE-decode the same modified radio block regardless of the eTFI value signaled. The eTFI capable wireless device 110 is aware of this XOR-ing operation, including the knowledge of the specific bits for which the beacon and eTFI XOR-ing has been performed. As such when assigned an eTFI, it can reverse the operation by performing the XOR operation in conjunction with, e.g. immediately prior to, the FIRE-decoding.

This is equally applicable in the downlink (DL) and in the uplink (UL). The proposed method is not limited to GERAN. It is not limited to signal eTFI information and is applicable to all types of error correcting codes with pre-determined capabilities, e.g. FIRE-code with the error correcting capability as described above.

In GERAN a number of logical channels such as the Packet Associated Control Channel (PACCH) and Slow Associated Control Channel (SACCH), to mention a few, are based on the channel encoding where a shortened FIRE-code is used, appending a 40 bit parity bit field to 184 information bits 3GPP TS 45.003, 3GPP; GERAN; Channel Coding.

These 40 parity bits can either be used to correct or detect errors or both detect and correct errors. This leads to a delicate tradeoff between improved Block Error Rate (BLER) and False Detection Rate (FDR). FDR, or False Positives rate, is referring to a receiver's capability to detect if a received block was erroneous or not. A "false" positive occurs when the block received is incorrect and after attempted error correction is still incorrect but is detected as correctly received by the receiver.

In the case of a GERAN receiver this balance is ultimately determined by a requirement stating that when exposed to a random input signal "the overall reception performance shall be such that no more than 0.002% of the frames are assessed to be error free" 3GPP TS 45.005, 3GPP; GERAN; Radio Transmission and reception. Based on this requirement it can be shown in theory that a GERAN receiver is typically not allowed to be configured for correction of burst error sequences of greater length than 17 bits.

Figure 3:
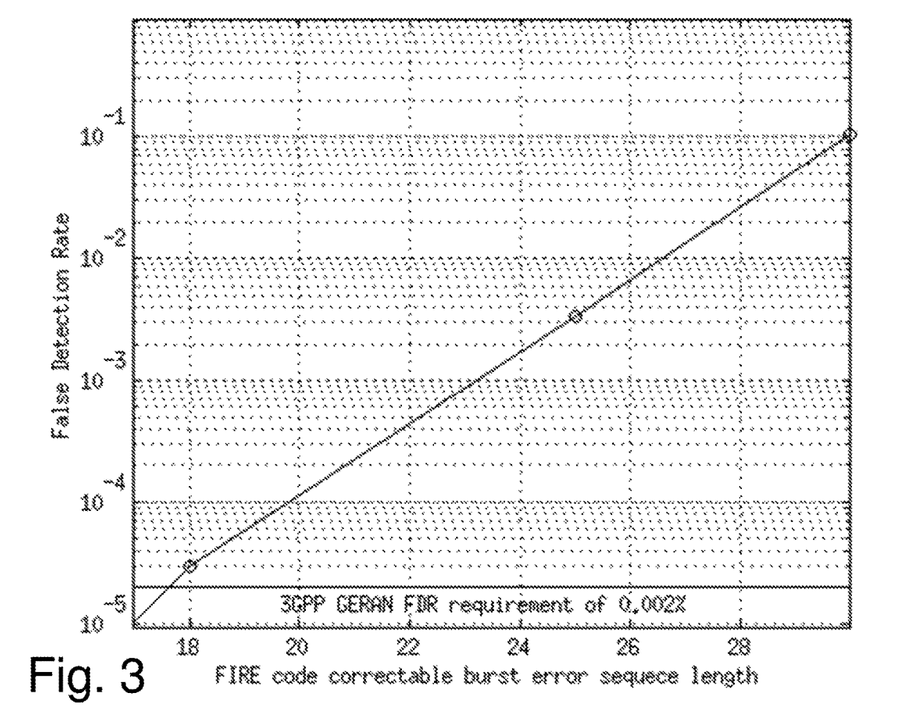
FIG. 3 is a diagram illustrating false detection rate as a function of FIRE-code correctable burst error length.

This is also confirmed in FIG. 3 where FDR is plotted as a function of correctable burst error sequence lengths. When the FIRE-decoder is configured to correct error bursts of length 18, or above, the GERAN FDR requirement of 0.002% is violated. FIG. 3 thus illustrates False Detection Rate of a GSM receiver as a function of configured FIRE-code correctable burst error sequence lengths when exposed to random input.

In the case of GERAN and a FIRE-encoded radio block, as an example of the FIRE-encoded control block, it is sufficient to, in the transmitter, XOR any bit sequence containing at minimum two 1's, designated as beacon 1's, separated by at least 17 bits to secure that a legacy MS will not be able to decode the same radio block. The legacy MS will effectively fail to correct the XOR'ed bit sequence, i.e. only one of the XOR'ed 1's can be corrected by the FIRE-code, and the legacy MS detects the received radio block as erroneous. If a target eTFI field is then inserted into the same bit sequence, i.e. in addition to the beacon 1's, and resulting bit sequence is XOR'ed into the FIRE-coded radio block the resulting radio block can be addressed to a wireless device 110 assigned that target eTFI value as it will be aware of the transmitter having already XOR'ed the beacon and target eTFI bit sequence prior to transmission of the modified radio block.

Figure 4:
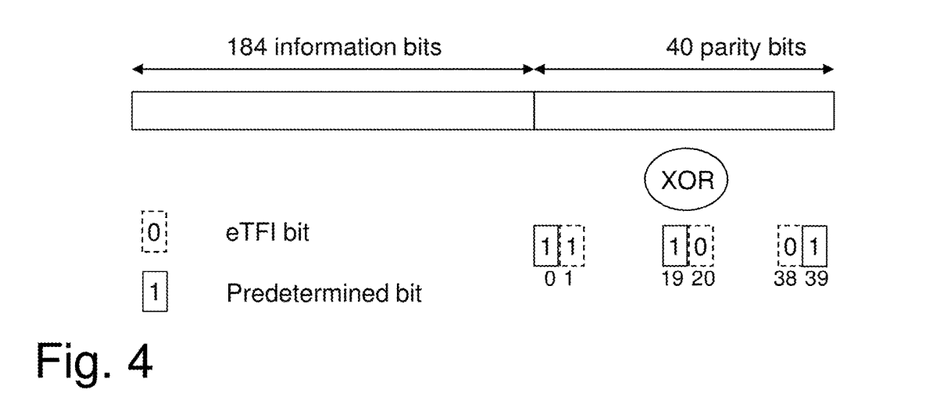
FIG. 4 is an overview illustrating information bits, parity bits, the eTFI and the pre-determined bit pattern.

Although the XORed bits can be spread over the entire FIRE-coded radio block, it is attractive to only apply them over the parity bits. Doing so allows e.g. an eTFI capable wireless device 110 to apply the XOR operation after it has run the FIRE-decoder and thereby produced the set of parity bits applicable to the received modified radio block. If the XOR'ed bit sequence, i.e. the beacon 1's and the eTFI bit pattern, is spread over the entire modified radio block the receiver must apply the XOR operation before it does the FIRE-decoding. In case a receiver is assigned multiple eTFIs for a given set of PDCH resources on a given carrier this will lead to a higher computational load (iterative decoding). With this in mind a simple but efficient solution would be to define the beacon bits as N 1's spread uniformly with equally spacing over the parity field. N eTFI bits can then be inserted adjacent to the beacon bits. This is illustrated in FIG. 4 assuming N=3 resulting in 3 beacon bits and 3 eTFI bits. FIG. 4 illustrates an example implementation of a three bit eTFI field='100', shown in boxes 1, 20, 38, along with three beacon 1's and performing the XOR operation over parity bits of a FIRE-encoded radio block.

Different options exist both on how the beacon bits and the eTFI bits can be placed in a FIRE-encoded radio block. As long as the error correcting capabilities of the underlying code (in the case of GERAN a shortened (224,184) FIRE-code) is not fulfilled by the beacon bits or the eTFI bits (the bits need to be separated by at least "b" bit positions), the legacy MS will not be able to successfully read the block (i.e. it will declare it to be uncorrectable), and will hence discard it.

It should be noted that the beacon bit pattern is used to secure that eTFI bit patterns of any weight, including zero-weight and single-weight patterns, can be assigned and signalled to an eTFI capable wireless device. In case it is known that the eTFI signaled contains at least two 1's, with an intermediate distance equal to or exceeding the shortest uncorrectable burst error length "b", then the beacon bit pattern is not required to be applied.

Embodiments in this disclosure outline a general method for signaling an information field by modifying a FIRE-encoded radio block. In terms of GERAN, it provides a backwards compatible extension of the TFI addressing space applicable to FIRE-encoded radio blocks.

Figure 5:
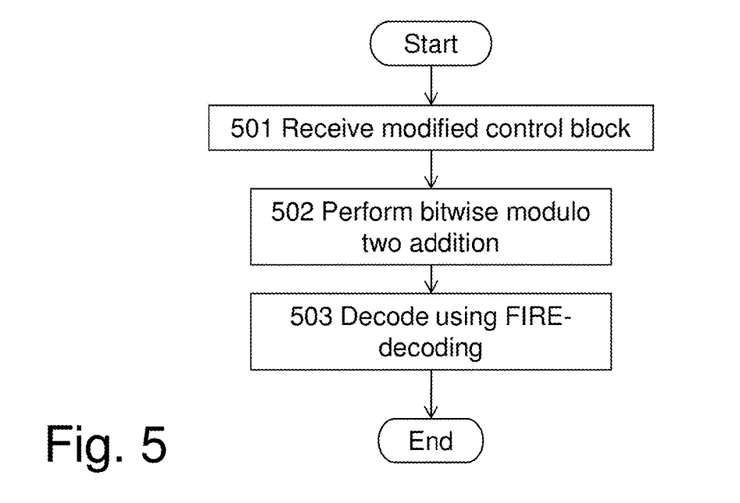
FIG. 5 is a flowchart illustrating embodiments of the method in the wireless device.

In FIG. 5, an exemplifying, schematic flowchart of embodiments of the method of the wireless device 110 as illustrated in FIG. 2 above is shown. Thus, the wireless device 110 performs a method for managing a modified control block.

As mentioned, the modified control block carries control information for the wireless device 110. The wireless device 110 is served by a radio network node 120. A TFI and an eTFI are assigned to the wireless device 110 by the radio network node 120.

Again, the modified control block may comprise parity bits. The pre-determined bit pattern may be applied among the parity bits. The pre-determined bit pattern may be distributed over a distance being equal to or exceeding a shortest uncorrectable burst error length. The shortest uncorrectable burst error length may be 18 bits. Bits of both the eTFI and the pre-determined bit pattern may be applied at pre-determined bit positions in the received modified control block. The pre-determined bit pattern may include three bits, wherein each of the three bits may be set.

The following actions may be performed in any suitable order.

Action 501

The wireless device 110 receives the modified control block from the radio network node 120. This action corresponds to action 207.

Action 502

The wireless device 110 performs a bit-wise modulo two addition between the modified control block and a combination of its assigned eTFI and a pre-determined bit pattern to obtain a control block.

As mentioned, the modified control block may comprise parity bits. Then, the bit-wise modulo two addition of the combination of the eTFI and the pre-determined bit pattern may be performed using bit positions among the parity bits.

This action corresponds to action 208.

Action 503

The wireless device 110 successfully decodes the control block using FIRE-decoding to obtain the control information. The wireless device 110 is an intended recipient of the control information when the TFI field of the control information matches the TFI assigned to the wireless device 110.

Bits of the eTFI may be applied among the parity bits.

This action corresponds to action 209.

Figure 6:
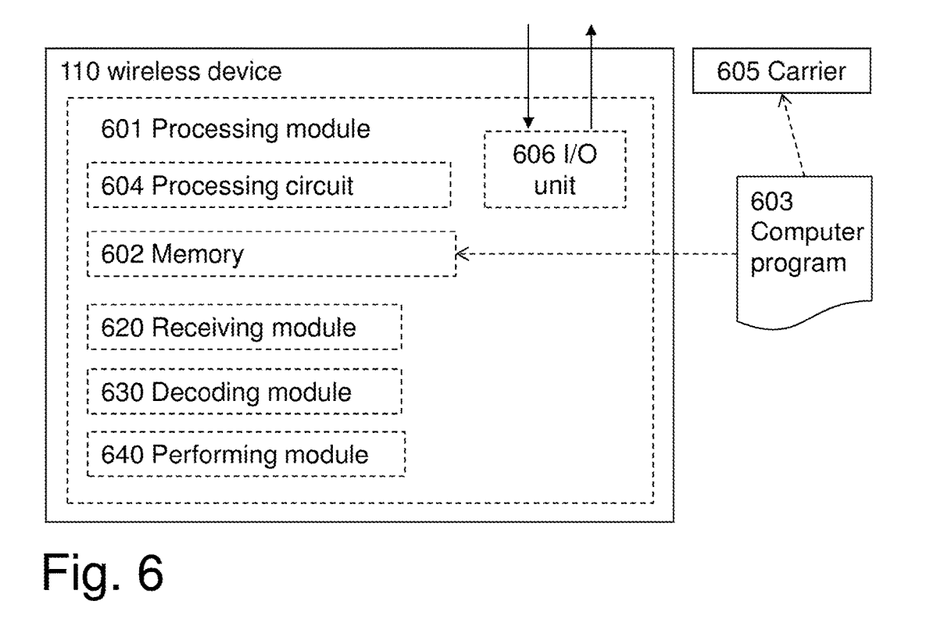
FIG. 6 is a block diagram illustrating embodiments of the wireless device.

With reference to FIG. 6, a schematic block diagram of embodiments of the wireless device 110 of FIG. 1 is shown. The wireless device 110 is configured to manage a modified control block for carrying control information for the wireless device 110.

As mentioned, the wireless device 110 is servable by a radio network node 120. A TFI and an eTFI are assignable to the wireless device 110 by the radio network node 120.

Again, the modified control block may comprise parity bits. The combination of, or only one of, the eTFI and the pre-determined bit pattern may be applied among the parity bits. The pre-determined bit pattern may be distributed over a distance being equal to or exceeding a shortest uncorrectable burst error length. The shortest uncorrectable burst error length may be 18 bits. Bits of both the eTFI and the pre-determined bit pattern may be applied at pre-determined bit positions in the received modified control block. The pre-determined bit pattern may include three bits, wherein each of the three bits may be set.

The wireless device 110 may comprise a processing module 601, such as a means, one or more hardware modules and/or one or more software modules for performing the methods described herein.

The wireless device 110 may further comprise a memory 602. The memory may comprise, such as contain or store, a computer program 603.

According to some embodiments herein, the processing module 601 comprises, e.g. 'is embodied in the form of' or 'realized by', a processing circuit 604 as an exemplifying hardware module. In these embodiments, the memory 602 may comprise the computer program 603, comprising computer readable code units executable by the processing circuit 604, whereby the wireless device 110 is operative to perform the methods of FIG. 2 and/or FIG. 5.

In some other embodiments, the computer readable code units may cause the wireless device 110 to perform the method according to FIGS. 2 and/or 5 when the computer readable code units are executed by the wireless device 110.

FIG. 6 further illustrates a carrier 605, comprising the computer program 603 as described directly above. The carrier 605 may be one of an electronic signal, an optical signal, a radio signal, and a computer readable medium.

In some embodiments, the processing module 601 comprises an Input/Output unit 606, which may be exemplified by a receiving module and/or a sending module as described below when applicable.

In further embodiments, the processing module 601 may comprise one or more of a receiving module 620, a decoding module 630, and a performing module 640 as exemplifying hardware modules. In other examples, one or more of the aforementioned exemplifying hardware modules may be implemented as one or more software modules.

Therefore, according to the various embodiments described above, the wireless device 110 is operative to and/or the wireless device 110, the processing module 601 and/or the receiving module 620 is configured to receive the modified control block from the radio network node 120.

The wireless device 110 is operative to and/or the wireless device 110, the processing module 601 and/or the performing module 640 is configured to perform a bit-wise modulo two addition between the modified control block and a combination of its assigned eTFI and a pre-determined bit pattern to obtain a control block.

The wireless device 110 is operative to and/or the wireless device 110, the processing module 601 and/or the decoding module 630 is further configured to decode the control block using FIRE-decoding to obtain the control information. The wireless device 110 is an intended recipient of the control information, e.g. when the FIRE-decoding is successful, and a TFI field of the control information matches the TFI assigned to the wireless device 110.

As mentioned, bits of the eTFI may be applied among the parity bits.

Figure 7:
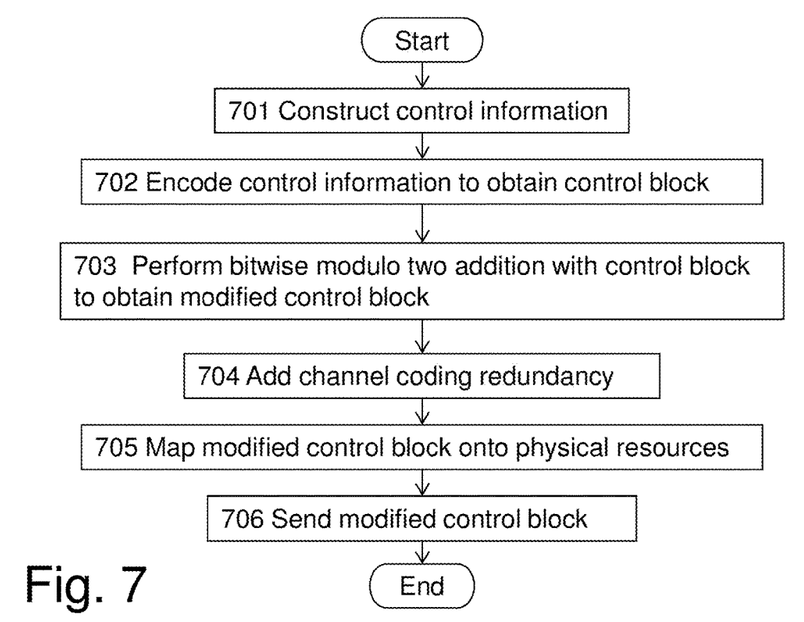
FIG. 7 is a flowchart illustrating embodiments of the method in the radio network node.

In FIG. 7, an exemplifying, schematic flowchart of embodiments of the method of the radio network node 120 as illustrated in FIG. 2 above is shown. Thus, the radio network node 120 performs a method for managing a control block for a wireless device 110.

As mentioned, the control block carries control information addressed to the wireless device 110. The wireless device 110 is served by the radio network node 120. A Temporary Flow Identifier, TFI, and an extended Temporary Flow Identifier, eTFI, is assigned to the wireless device 110 by the radio network node 120.

Again, the control block may comprise parity bits. The pre-determined bit pattern may be applied among the parity bits. Bits of the eTFI may be applied among the parity bits. The pre-determined bit pattern may be distributed over a distance being equal to or exceeding a shortest uncorrectable burst error length. The shortest uncorrectable burst error length may be 18 bits. Bits of both the eTFI and the pre-determined bit pattern may be applied at pre-determined bit positions in the control block. The pre-determined bit pattern may include three bits, wherein each of the three bits may be set.

The following actions may be performed in any suitable order.

Action 701

The radio network node 120 constructs the control information, wherein a header portion of the control information comprises the TFI assigned to the wireless device 110. This action corresponds to action 201.

Action 702

The radio network node 120 encodes control information, using FIRE-encoding, to obtain a FIRE-encoded control block. This action corresponds to action 202.

Action 703

The radio network node 120 performs a bit-wise modulo two addition with the FIRE-encoded control block and a combination of the eTFI and a pre-determined bit pattern to obtain a modified control block.

As mentioned, the modified control block may comprise parity bits. Then, the bit-wise modulo two addition of the combination of the eTFI and the pre-determined bit pattern may be performed using bit positions among the parity bits. This action corresponds to action 203.

Action 704

The radio network node 120 adds channel coding redundancy to the modified control block. This action corresponds to action 204.

Action 705

The radio network node 120 maps the modified control block onto physical resources. This action corresponds to action 205.

Action 706

The radio network node 120 sends the modified control block to the wireless device 110. This action corresponds to action 206.

Figure 8:
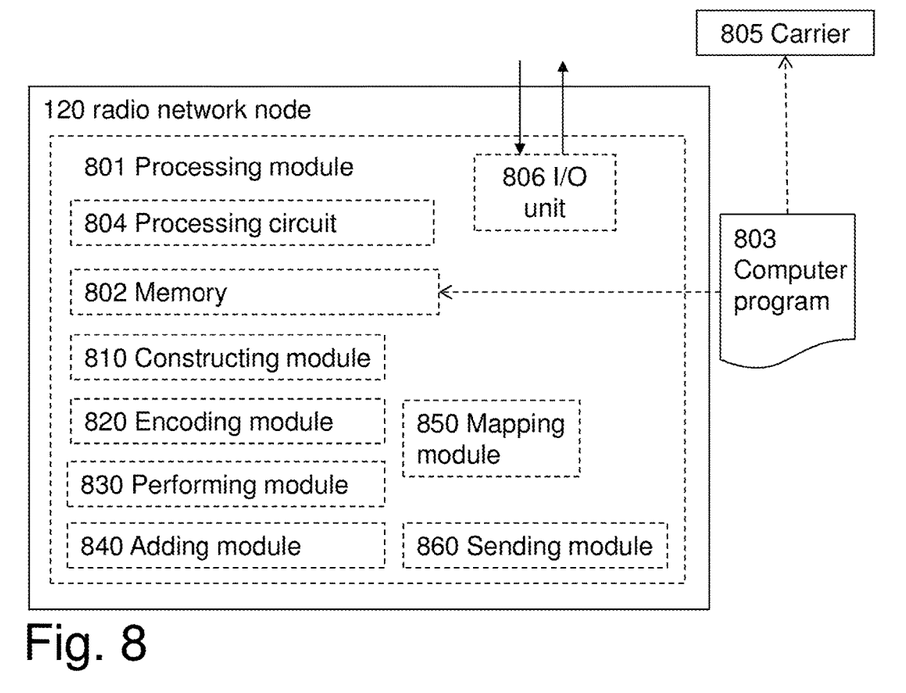
FIG. 8 is a block diagram illustrating embodiments of the radio network node.

With reference to FIG. 8, a schematic block diagram of embodiments of the radio network node 120 of FIG. 1 is shown. The radio network node 120 is configured to manage a control block for a wireless device 110.

As mentioned, the control block is capable of carrying control information addressed to the wireless device 110. The wireless device 110 is servable by the radio network node 120. A TFI and an eTFI are assignable to the wireless device 110 by the radio network node 120.

Again, the modified control block may comprise parity bits. The combination of, or only one of, the eTFI and the pre-determined bit pattern may be applied among the parity bits. Bits of the eTFI may be applied among the parity bits. The pre-determined bit pattern may be distributed over a distance being equal to or exceeding a shortest uncorrectable burst error length. The shortest uncorrectable burst error length may be 18 bits. Bits of both the eTFI and the pre-determined bit pattern may be applied at pre-determined bit positions in the control block. The pre-determined bit pattern may include three bits, wherein each of the three bits may be set.

The radio network node 120 may comprise a processing module 801, such as a means, one or more hardware modules and/or one or more software modules for performing the methods described herein.

The radio network node 120 may further comprise a memory 802. The memory may comprise, such as contain or store, a computer program 803.

According to some embodiments herein, the processing module 801 comprises, e.g. 'is embodied in the form of' or 'realized by', a processing circuit 804 as an exemplifying hardware module. In these embodiments, the memory 802 may comprise the computer program 803, comprising computer readable code units executable by the processing circuit 804, whereby the radio network node 120 is operative to perform the methods of FIG. 2 and/or FIG. 7.

In some other embodiments, the computer readable code units may cause the radio network node 120 to perform the method according to FIGS. 2 and/or 7 when the computer readable code units are executed by the radio network node 120.

FIG. 8 further illustrates a carrier 805, comprising the computer program 803 as described directly above. The carrier 805 may be one of an electronic signal, an optical signal, a radio signal, and a computer readable medium.

In some embodiments, the processing module 601 comprises an Input/Output unit 806, which may be exemplified by a receiving module and/or a sending module as described below when applicable.

In further embodiments, the processing module 801 may comprise one or more of a constructing module 810, an encoding module 820, a performing module 830, an adding module 840, a mapping module 850 and a sending module 860 as exemplifying hardware modules. In other examples, one or more of the aforementioned exemplifying hardware modules may be implemented as one or more software modules.

Therefore, according to the embodiments above, the radio network node 120 is operative to and/or the radio network node 120, the processing module 801 and/or the constructing module 810 is configured to construct the control information, wherein a header portion of the control information comprises the TFI assigned to the wireless device 110.

The radio network node 120 is operative to and/or the radio network node 120, the processing module 801 and/or the encoding module 820 is configured to encode the control information, using FIRE-encoding, to obtain a FIRE-encoded control block.

The radio network node 120 is operative to and/or the radio network node 120, the processing module 801 and/or the performing module 830 is configured to perform a bit-wise modulo two addition with the FIRE-encoded control block and a combination of the eTFI and a pre-determined bit pattern to obtain a modified control block.

The radio network node 120 is operative to and/or the radio network node 120, the processing module 801 and/or the adding module 840 is configured to add channel coding redundancy to the modified control block.

The radio network node 120 is operative to and/or the radio network node 120, the processing module 801 and/or the mapping module 850 is configured to map the modified control block onto physical resources.

The radio network node 120 is operative to and/or the radio network node 120, the processing module 801 and/or the sending module 860 is configured to send the modified control block to the wireless device 110.

As used herein, the term "processing module" may in some examples refer to the processing circuit, such as a processing unit, a processor, an Application Specific Integrated Circuit (ASIC), a Field-Programmable Gate Array (FPGA) or the like. The processing circuit or the like may comprise one or more processor kernels. In these examples, the processing module is thus embodiment by a hardware module. In other examples, the processing module may be embodied by a software module. Any such module, be it a hardware, software or a combined hardware-software module, may be a determining means, estimating means, capturing means, associating means, comparing means, identification means, selecting means, receiving means, sending means or the like as disclosed herein. As an example, the expression "means" may be a module corresponding to the modules listed above in conjunction with the Figures.

As used herein, the expression "configured to" may mean that a processing circuit is configured to, or adapted to, by means of software configuration and/or hardware configuration, perform one or more of the actions described herein.

As used herein, the term "memory" may refer to a hard disk, a magnetic storage medium, a portable computer diskette or disc, flash memory, random access memory (RAM) or the like. Furthermore, the term "memory" may refer to an internal register memory of a processor or the like.

As used herein, the term "computer readable medium" may be a Universal Serial Bus (USB) memory, a DVD-disc, a Blu-ray disc, a software module that is received as a stream of data, a Flash memory, a hard drive, a memory card, such as a Memory Stick, a Multimedia Card (MMC), etc.

As used herein, the term "computer readable code units" may be text of a computer program, parts of or an entire binary file representing a computer program in a compiled format or anything there between.

As used herein, the terms "number", "value" may be any kind of digit, such as binary, real, imaginary or rational number or the like. Moreover, "number", "value" may be one or more characters, such as a letter or a string of letters. "number", "value" may also be represented by a bit string.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. A method, performed by a wireless device, for managing a modified control block, wherein the modified control block carries control information for the wireless device, wherein the modified control block is encoded using a FIRE code, wherein the wireless device is served by a radio network node, wherein a Temporary Flow Identifier, TFI, and an extended Temporary Flow Identifier, eTFI, are assigned to the wireless device by the radio network node, wherein the method comprises:

receiving the modified control block from the radio network node;

performing a bit-wise modulo two addition between the modified control block and a combination of the eTFI and a pre-determined bit pattern to obtain a control block, wherein the pre-determined bit pattern is distributed over a distance being equal to or exceeding a shortest uncorrectable burst error length associated with the FIRE code; and decoding the control block using FIRE-decoding to obtain the control information, wherein the modified control block comprises parity bits, wherein the bit-wise modulo two addition between the modified control block and the combination of the eTFI and the pre-determined bit pattern is performed using bit positions among the parity bits to obtain the control block.

2. The method according to claim 1, wherein consecutive bits within the pre-determined bit pattern or consecutive bits within the eTFI are separated by a distance being equal to or exceeding the shortest uncorrectable burst error length.

3. The method according to claim 2, wherein the shortest uncorrectable burst error length is 18 bits.

4. The method according to claim 1, wherein the bit-wise modulo two addition between the modified control block and the combination of the eTFI and the pre-determined bit pattern is performed using pre-determined bit positions in the received modified control block.

5. The method according to claim 1, wherein the pre-determined bit pattern includes three bits, wherein each of the three bits is set.

6. The method according to claim 1, further comprising:
reading a TFI from a header portion of the control information;
comparing the read TFI with the TFI assigned to the wireless device; and
determining the control information is intended for the wireless device when the read TFI and the assigned TFI match.

7. A method, performed by a radio network node, for managing a control block for a wireless device, wherein the control block carries control information addressed to the wireless device, wherein the wireless device is served by the radio network node, wherein a Temporary Flow Identifier, TFI, and an extended Temporary Flow Identifier, eTFI, are assigned to the wireless device by the radio network node, wherein the method comprises:
constructing the control information, wherein a header portion of the control information comprises the TFI assigned to the wireless device;
encoding the control information including the header portion, using a FIRE code, to obtain a FIRE-encoded control block;
performing a bit-wise modulo two addition between the FIRE-encoded control block and a combination of the eTFI and a pre-determined bit pattern to obtain a modified control block, wherein the pre-determined bit pattern is distributed over a distance being equal to or exceeding a shortest uncorrectable burst error length associated with the FIRE code;
adding channel coding redundancy to the modified control block;
mapping the modified control block onto physical resources; and
sending the modified control block to the wireless device, wherein the FIRE-encoded control block comprises parity bits, wherein the bit-wise modulo two addition between the FIRE-encoded control block and the combination of the eTFI and the pre-determined bit pattern is performed using bit positions among the parity bits to obtain the modified control block.

8. The method according to claim 7, wherein consecutive bits within the pre-determined bit pattern or consecutive bits within the ETFI are separated by a distance being equal to or exceeding the shortest uncorrectable burst error length.

9. The method according to claim 8, wherein the shortest uncorrectable burst error length is 18 bits.

10. The method according to claim 7, wherein the bit-wise modulo two addition between the FIRE-encoded control block and the combination of the eTFI and the pre-determined bit pattern is performed using pre-determined bit positions in the FIRE-encoded control block.

11. The method according to claim 7, wherein the pre-determined bit pattern includes three bits, wherein each of the three bits is set.

12. A wireless device configured to manage a modified control block for carrying control information for the wireless device, wherein the modified control block is encodable using a FIRE code, wherein the wireless device is servable by a radio network node, wherein a Temporary Flow Identifier, TFI, and an extended Temporary Flow Identifier, eTFI, are assignable to the wireless device by the radio network node, wherein the wireless device comprises:
a processing circuit; and
a non-transitory memory that stores computer readable program code;
wherein when the processing circuit executes the computer readable program code, the wireless device is caused to:
receive the modified control block from the radio network node;
perform a bit-wise modulo two addition between the modified control block and a combination of the eTFI and a pre-determined bit pattern to obtain a control block, wherein the pre-determined bit pattern is distributed over a distance being equal to or exceeding a shortest uncorrectable burst error length associated with the FIRE code; and
decode the control block using FIRE-decoding to obtain the control information,
wherein the modified control block comprises parity bits, wherein the bit-wise modulo two addition between the modified control block and the combination of the eTFI and the pre-determined bit pattern is performed using bit positions among the parity bits to obtain the control block.

13. The wireless device according to claim 12, wherein consecutive bits within the pre-determined bit pattern or consecutive bits within the eTFI are separated by a distance being equal to or exceeding the shortest uncorrectable burst error length.

14. The wireless device according to claim 13, wherein the shortest uncorrectable burst error length is 18 bits.

15. The wireless device according to claim 12, wherein the bit-wise modulo two addition between the modified control block and the combination of the eTFI and the pre-determined bit pattern is performed using pre-determined bit positions in the received modified control block.

16. The wireless device according to claim 12, wherein the pre-determined bit pattern includes three bits, wherein each of the three bits is set.

17. The wireless device according to claim 12, wherein when the processing circuit executes the computer readable program code, the wireless device is further caused to read a TFI from a header portion of the control information, compare the read TFI with the TFI assigned to the wireless device, and determine the control information is intended for the wireless device when the read TFI and the assigned TFI match.

18. A radio network node configured to manage a control block for a wireless device, wherein the control block is capable of carrying control information addressed to the wireless device, wherein the wireless device is servable by the radio network node, wherein a Temporary Flow Identifier, TFI, and an extended Temporary Flow Identifier, eTFI, are assignable to the wireless device by the radio network node, wherein the radio network node comprises:
   a processing circuit; and
   a non-transitory memory that stores computer readable program code;
   wherein when the processing circuit executes the computer readable program code, the radio network node is caused to:
      construct the control information, wherein a header portion of the control information comprises the TFI assigned to the wireless device;
      encode the control information including the header portion, using a FIRE code, to obtain a FIRE-encoded control block;
      perform a bit-wise modulo two addition between the FIRE-encoded control block and a combination of the eTFI and a pre-determined bit pattern to obtain a modified control block, wherein the pre-determined bit pattern is distributed over a distance being equal to or exceeding a shortest uncorrectable burst error length associated with the FIRE code;
      add channel coding redundancy to the modified control block;
      map the modified control block onto physical resources; and
      send the modified control block to the wireless device,
      wherein the FIRE-encoded control block comprises parity bits, wherein the bit-wise modulo two addition between the FIRE-encoded control block and the combination of the eTFI and the pre-determined bit pattern is performed using bit positions among the parity bits to obtain the modified control block.

19. The radio network node according to claim 18, wherein consecutive bits within the pre-determined bit pattern or consecutive bits within the ETFI are separated by a distance being equal to or exceeding the shortest uncorrectable burst error length.

20. The radio network node according to claim 19, wherein the shortest uncorrectable burst error length is 18 bits.

21. The radio network node according to claim 18, wherein the bit-wise modulo two addition between the FIRE-encoded control block and the combination of the eTFI and the pre-determined bit pattern is performed using pre-determined bit positions in the FIRE-encoded control block.

22. The radio network node according to claim 18, wherein the pre-determined bit pattern includes three bits, wherein each of the three bits is set.

* * * * *